(12) United States Patent
Vosgroene et al.

(10) Patent No.: US 8,906,264 B2
(45) Date of Patent: Dec. 9, 2014

(54) SILICATE PHOSPHORS

(75) Inventors: Tim Vosgroene, Ober-Ramstadt (DE);
Daniela Degenring, Gernsheim (DE);
Stefan Schlueter, Bickenbach (DE);
Sascha Hess, Gross-Rohrheim (DE);
Andrea Opolka, Suederholz (DE); Eric Heiden, Greifswald (DE)

(73) Assignee: Merck Patent GmbH, Darmstadt (DE)

( * ) Notice: Subject to any disclaimer, the term of this patent is extended or adjusted under 35 U.S.C. 154(b) by 0 days.

(21) Appl. No.: 13/988,040

(22) PCT Filed: Feb. 24, 2012

(86) PCT No.: PCT/EP2012/000814
§ 371 (c)(1),
(2), (4) Date: May 17, 2013

(87) PCT Pub. No.: WO2012/126561
PCT Pub. Date: Sep. 27, 2012

(65) Prior Publication Data
US 2013/0341664 A1    Dec. 26, 2013

(30) Foreign Application Priority Data
Mar. 18, 2011   (EP) .................................... 11002247

(51) Int. Cl.
*C09K 11/77* (2006.01)
*H01L 33/50* (2010.01)

(52) U.S. Cl.
CPC ............ *C09K 11/774* (2013.01); *H01L 33/502* (2013.01)
USPC .............. 252/301.4 F; 252/301.6 F; 313/503; 257/97; 349/71

(58) Field of Classification Search
USPC ........ 252/301.4 F, 301.6 F; 313/503; 257/97; 349/71
See application file for complete search history.

(56) References Cited

U.S. PATENT DOCUMENTS

| | | | |
|---|---|---|---|
| 4,451,757 A * | 5/1984 | Lagos | ........................... 313/489 |
| 7,573,072 B2 | 8/2009 | Setlur et al. | |
| 2005/0199897 A1 | 9/2005 | Setlur et al. | |
| 2006/0012284 A1 | 1/2006 | Kim et al. | |
| 2010/0201250 A1 | 8/2010 | Winkler et al. | |

FOREIGN PATENT DOCUMENTS

| | | |
|---|---|---|
| JP | 2009102524 A | 5/2009 |
| JP | 4315371 | 8/2009 |
| JP | 2011 16881 | 1/2011 |
| JP | 2012079883 A | 4/2012 |
| WO | WO-2004 067677 | 8/2004 |
| WO | WO-2008 122332 | 10/2008 |

OTHER PUBLICATIONS

Office Action for related Japanese Patent Application No. 2013-539304 dated Nov. 26, 2013.
English Translation of Iwanami Rikagaku Jiten, 4th Ed., p. 227, Oct. 12, 1987.
International Search Report for PCT/EP2012-000814; Date of the actual completion of the international search: Apr. 4, 2012, Date of mailing of the international report: Apr. 23, 2012.

* cited by examiner

*Primary Examiner* — Carol M Koslow
(74) *Attorney, Agent, or Firm* — Millen, White, Zelano & Branigan, P.C.

(57) ABSTRACT

The invention relates to compounds of the general formula (I) EA2-xEuxSiO4.aM2B4O7 (I) where EA stands for two or more elements selected from Ca, Sr, Zn and Ba, M stands for Li, Na or K, and a stands for a value from the range $0.01 \leq a \leq 0.08$, and x stands for a value from the range $0.01 \leq x \leq 0.25$.

16 Claims, 3 Drawing Sheets

SILICATE PHOSPHORS

The invention relates to silicate compounds comprising alkali metal borate, to a process for the preparation of these compounds, and to the use thereof as conversion phosphors or in lamps.

Inorganic fluorescent powders which can be excited in the blue and/or UV region of the spectrum are gaining ever-greater importance as phosphors for so-called phosphor-converted LEDs, pc-LEDs for short.

In the meantime, many phosphor material systems have been disclosed, for example alkaline-earth metal orthosilicates, thiogallates, garnets and nitrides, each of which are doped with cerium$^{3+}$ or Eu$^{2+}$.

Europium-doped alkaline-earth metal orthosilicates were described for the first time as long ago as 1968 by T. Barry (T. L. Barry, J. Electrochem. Soc. (1968), 115(11), 1181-4).

In the last ten years, these compounds have been employed to an ever-greater extent in pc-LEDs. The major advantage of these very efficient phosphors consists in that an emission wavelength range from 505 to 610 nm is accessible by variation of the composition.

However, a disadvantage of these materials is their sensitivity to moisture. In particular, compounds having a high barium content in the crystal lattice gradually hydrolyse on contact with water. This results in destruction of the crystal lattice, causing the phosphor drastically to lose intensity.

EP 0019710 describes a filter-coated phosphor, such as, for example, sulfides, which is provided with filter particles comprising pigments, where the pigments have been coated with metal borate. The borate coating serves to increase the adhesion of the pigment particles to the phosphor.

WO 02/054502 describes alkaline-earth metal orthosilicates which, besides phosphorus pentoxide, aluminium oxide or germanium oxide, also comprise boron oxide (B$_2$O$_3$), where boron is in some cases incorporated at the lattice site of silicon.

The object of the present invention is to develop certain alkaline-earth metal orthosilicate phosphors which have good stability to moisture.

A further object of the present invention consists in providing a process for the preparation of these alkaline-earth metal orthosilicate phosphors.

In addition, an object of the invention also consists in providing a mixture of the said alkaline-earth metal orthosilicate phosphor with further phosphors.

In addition, a further object of the invention consists in indicating various possible uses of these phosphors.

Surprisingly, it has now been found that alkaline-earth metal orthosilicate phosphors, in particular europium-doped alkaline-earth metal orthosilicate phosphors, which comprise alkali metal borate (M$_2$B$_4$O$_7$) achieve the above-mentioned object.

The present invention therefore relates to a compound of the formula I, $$EA_{2-x}Eu_xSiO_4 \cdot aM_2B_4O_7 \quad (I)$$

where
EA stands for two or more elements selected from Ca, Sr, Zn and Ba,
M stands for Li, Na or K, and
a stands for a value from the range 0.01≤a≤0.08, and
x stands for a value from the range 0.01x≤0.25.

M preferably stands for Na or K, particularly preferably for Na. EA preferably stands for Ba and Sr. However, embodiments in which EA stands for Ba and Sr and Ca and embodiments in which EA stands for Ba and Sr and Zn are also possible. However, particular preference is given to embodiments of the present invention in which EA stands for Ba and Sr. It is very particularly preferred here for the Ba:Sr ratio to be in the range 0.4-1.2, in particular in the range 0.7-1.1.

a preferably stands for a value from the range 0.01≤a≤0.05.

x preferably stands for a value from the range 0.03≤x≤0.20, particularly preferably for a value from the range 0.04≤x≤0.13.

Europium is exclusively in divalent form in the compound of the formula I according to the invention.

The compounds of the formula I are phosphors whose emission wavelength range is from 505 to 610 nm and is thus unchanged compared with the emission wavelengths of phosphors of the composition EA$_{2-x}$Eu$_x$SiO$_4$, where EA stands for two or more elements selected from Ca, Sr, Zn and Ba, and x stands for a value from the range 0.01≤x≤0.25.

Accordingly, they facilitate emission colours in range from orange via yellow to green.

In the context of this application, green light is regarded as light whose intensity maximum is at a wavelength between 505 and 545 nm, yellow light is regarded as light whose intensity maximum is at a wavelength between 545 and 565 nm, orange light is regarded as light whose intensity maximum is at a wavelength between 565 and 600 nm, and red light is regarded as light whose intensity maximum is at a wavelength between 600 and 670 nm.

The phosphors according to the invention can be excited over a broad range which extends from about 410 nm to 530 nm, preferably 430 nm to about 500 nm. These phosphors are suitable not only for excitation by UV- or blue-emitting light sources, such as LEDs or conventional energy-discharge lamps (for example based on Hg), but also for light sources which utilise the blue In$^{3+}$ line at 451 nm.

The compounds of the formula I according to the invention are also referred to below for simplification as silicate phosphors.

The silicate phosphors according to the invention have amazingly high resistance to contact with moisture, as will be explained in greater detail below, and can be prepared by a simple process.

The invention therefore furthermore relates to a process for the preparation of a compound of the formula I, comprising the following process steps:
a) providing an M$_2$B$_4$O$_7$-containing solution, where M=Li, Na or K (solution A)
b) providing a phosphor of the composition EA$_{2-x}$Eu$_x$SiO$_4$, where EA stands for two or more elements selected from Ca, Sr, Zn and Ba, and x stands for a value from the range 0.01≤x≤0.25 (phosphor B)
c) addition and intimate mixing 1 phosphor B with solution A,
d) washing, and
e) subsequent drying.

The molar ratio of M$_2$B$_4$O$_7$ from step a) and EA$_{2-x}$Eu$_x$SiO$_4$ from step b) is set here in such a way that a value a from formula I in the range from 0.01 to 0.08, preferably from 0.01 to 0.05, arises. In order to obtain this, a suitable excess of alkali metal borate is provided for the reaction. This can be determined in a simple manner by the person skilled in the art from his expert knowledge.

The washing in step d) ifspreferably carried out in accordance with the invention by means of a water-soluble solvent, such as, for example, ethanol, methanol or acetone. Ethanol is particularly preferably employed.

An M$_2$B$_4$O$_7$-containing solution is preferably provided from commercially available salts (such as, for example, Na$_2$B$_4$O$_7$ from Merck), which are preferably employed in the form of a solution in water.

Phosphors of the composition $EA_{2-x}Eu_xSiO_4$, where EA stands for two or more elements selected from Ca, Sr, Zn and Ba, and x stands for a value from the range $0.01 \leq x \leq 0.25$, are known per se and are commercially available.

They are prepared by known processes, preferably by mixing europium- and silicon-containing compounds (preferably oxides, carbonates or oxalates) with barium- and strontium-, and optionally calcium- or zinc-containing materials (likewise preferably oxides, carbonates or oxalates), in general with addition of at least one further inorganic or organic substance, which is usually employed as fluxing agent, and thermal treatment of the mixture. The oxides or carbonates of each of europium, silicon, barium, strontium, zinc and/or calcium are particularly preferably employed in each case.

The said thermal treatment is preferably carried out at least partly under reducing conditions. The reaction here is usually carried out at a temperature above 800° C., preferably above 1200° C., particularly preferably between 1300 and 1500° C.

The at least partially reducing conditions here are established, for example, using carbon monoxide, forming gas or hydrogen (reducing conditions) or at least by means of vacuum or an oxygen-deficiency atmosphere (partially reducing conditions). A reducing atmosphere is preferably established by means of a nitrogen/hydrogen atmosphere and particularly preferably in a stream of $N_2/H_2$ (90-70:10-30).

The fluxing agents optionally employed are at least one substance from the group of the ammonium halides, preferably ammonium chloride, alkaline-earth metal fluorides, such as calcium fluoride, strontium fluoride or barium fluoride, carbonates, preferably ammonium hydrogencarbonate, or various alkoxides and/or oxalates. In the case of the use of the said alkaline-earth metal fluorides as fluxing agents, however, the proportion thereof must be included in the stoichiometric ratio of the components in the formula $EA_{2-x}Eu_xSiO_4$ (EA and x as described above). Ammonium chloride is particularly preferably employed.

The phosphors of the formula $EA_{2-x}Eu_xSiO_4$ (EA and x as described above) are preferably prepared here by a solid-state diffusion method (starting, for example, from oxides, carbonates or oxalates of the corresponding alkaline-earth metals, alkali metals or rare earths). However, processes are also known by means of which the phosphors can be prepared by wet-chemical methods from the corresponding inorganic and/or organic salts via a sol-gel process, co-precipitation process and/or drying process.

The provision of the phosphors of the formula $EA_{2-x}Eu_x$-$SiO_4$ (EA and x as described above) for step b) of the above-described preparation process according to the invention can be carried out immediately before the reaction according to the invention with an $M_2B_4O_7$-containing solution (meaning of M as described above) and can thus be integrated into the process according to the invention as a preliminary step, or also optionally at a greater time interval from the process according to the invention. As already mentioned above, these are commercially available products.

The silicate phosphors according to the invention can also be mixed with other phosphors, and, in particular if they have a comparatively high relative content of barium ($\lambda_{max} < 545$ nm), preferably with red-emitting phosphors, making mixtures of this type very highly suitable for applications in general lighting (for example for warm-white LEDs) and LCD backlighting.

The present invention therefore furthermore relates to a mixture comprising at least one compound of the formula I and at least one further phosphor, preferably a red-emitting phosphor.

The red-emitting phosphor here is preferably selected from Eu-doped sulfoselenides and Eu- and/or Ce-doped nitrides, oxynitrides, alumosilico-nitrides and/or Mn(IV)-doped oxides and/or fluorides. It may be particularly preferred here for the red-emitting phosphor to be selected from nitridic phosphors, preferably $(Ca,Sr,Ba)_2Si_5N_8$:Eu, $(Ca,Sr)AlSiN_3$:Eu, $A_{2-0.5y-x}Eu_xSi_5N_{8-y}O_y$, where A stands for one or more elements selected from Ca, Sr and Ba, x stands for a value from the range from 0.005 to 1, and y stands for a value from the range from 0.01 to 3, or variants of the said compounds in which individual lattice positions have been substituted by other chemical elements, such as alkali metals, aluminium, gallium or gadolinium, or further elements of this type occupy flaws as dopant. Suitable material systems which are known to the person skilled in the art are siliconitrides and alumosiliconitrides (cf. Xie, Sci. Technol. Adv. Mater. 2007, 8, 588-600), 2-5-8 nitrides, such as $(Ca,Sr,Ba)_2Si_5N_8$:Eu$^{2+}$ (Li et al., Chem. Mater. 2005, 15, 4492), and alumosiliconitrides, such as $(Ca,Sr)AlSiN_3$:Eu$^{2+}$ (K. Uheda et al., Electrochem. Solid State Lett. 2006, 9, H22).

The red-emitting phosphor employed is particularly preferably a phosphor of the compound $A_{2-0.5y-x}Eu_xSi_5N_{8-y}O_y$, where A stands for one or more elements selected from Ca, Sr and Ba, and x stands for a value from the range from 0.005 to 1, and y stands for a value from the range from 0.01 to 3. Compounds of this type are described in greater detail in the patent application PCT/EP2010/007954 and are referred to below as compound of the formula II. The compound of the formula II can be in the form of a pure substance or in the form of a mixture with at least one further silicon- and oxygen-containing compound, it being preferred for the at least one further silicon- and oxygen-containing compound to be a reaction by-product from the preparation of the compound of the formula II and for this not to disadvantageously influence the application-relevant optical properties of the compound of the formula II. In the compounds of the formula II, A in preferred embodiments stands for Sr, while x in preferred embodiments stands for a value from the range from 0.01 to 0.8, preferably from the range 0.02 to 0.7 and particularly preferably from the range 0.05 to 0.6 and especially preferably from the range 0.1 to 0.4, and y in preferred embodiments stands for a value from the range from 0.1 to 2.5, preferably from the range 0.2 to 2 and particularly preferably from the range 0.22 to 1.8.

For the preparation of phosphors of the formula II, suitable starting materials selected from binary nitrides and oxides or corresponding reactive forms are mixed in a first process step, and the mixture is thermally treated under reductive conditions in a second process step. This thermal treatment is preferably carried out at least partly under reducing conditions.

The reaction in the second process step is usually carried out at a temperature above 800 C, preferably at a temperature above 1200° C. and particularly preferably in the range 1400° C.-1800° C. The reductive conditions here are established, for example, using carbon monoxide, forming gas or hydrogen or at least vacuum or an oxygen-deficiency atmosphere, preferably in a stream of nitrogen, preferably in a stream of $N_2/H_2$ and particularly preferably in a stream of $N_2/H_2/NH_3$. If it is intended to prepare the compounds of the formula II in pure form, this can be carried out either by precise control of the starting-material stoichiometry or by mechanical separation of the crystals of the compounds of the formula II from the glass-like components. The separation can be carried out, for example, via the different density, particle shape or particle size by separation methods known to the person skilled in the art.

In the mixture according to the invention of at least one phosphor of the formula I and at least one further phosphor, in particular at least one red-emitting phosphor, the ratio of phosphors of the formula I and the further phosphor(s) is in accordance with the invention 20:1 to 1:1, based on the total weight of the phosphors. It is preferred in accordance with the invention for the at least one phosphor of the formula I and the at least one further phosphor, in particular the at least one red-emitting phosphor, to be present in the weight ratio 10:1 to 3:1 and particularly preferably 6:1 to 4:1, based on the total weight of these phosphors.

The silicate phosphors of the formula I according to the invention are in particulate form and have a particle size which is usually between 50 nm and 30 μm, preferably between 1 μm and 20 μm.

The phosphor particles according to the invention may also have a surface which carries functional groups which facilitate chemical bonding to the environment, preferably consisting of epoxy or silicone resin. These functional groups can be, for example, esters or other derivatives which are bonded via oxo groups and are able to form links to constituents of the binders based on epoxides and/or silicones. Surfaces of this type have the advantage that homogeneous incorporation of the phosphors into the binder is facilitated. Furthermore, the rheological properties of the phosphor/binder system and also the pot lives can thereby be adjusted to a certain extent. Processing of the mixtures is thus simplified.

The silicate phosphors according to the invention can particularly advantageously be employed in light-emitting diodes (LEDs), and especially in the pc-LEDs already mentioned above.

For use in LEDs, the silicate phosphors according to the invention can also be converted into any desired other outer shapes, such as spherical particles, flakes and structured materials and ceramics. These shapes are usually summarised under the term "shaped bodies". The shaped body here is preferably a "phosphor body".

The silicate phosphors of the formula I according to the invention are therefore particularly preferably employed in shaped bodies, or in phosphor bodies, comprising the silicate phosphors according to the invention.

The production of ceramic phosphor bodies comprising the silicate phosphors according to the invention is preferably carried out analogously to the process described in DE 10349038. The said patent specification is therefore incorporated in its full scope into the context of the present application by way of reference. In this process, the phosphor is subjected to isostatic pressing and applied directly to the surface of a chip in the form of a homogeneous, thin and non-porous flake. There is thus no locationdependent variation of the excitation and emission of the phosphor, which means that the LED provided therewith emits a homogeneous light cone of constant colour and has high light output. The ceramic phosphor bodies can be produced on a large industrial scale, for example, as flakes in thicknesses of a few 100 nm to about 500 μm. The flake dimensions (length×width) are dependent on the arrangement. In the case of direct application to the chip, the size of the flake should be selected in accordance with the chip dimensions (from about 100 μm*100 μm to several mm$^2$) with a certain oversize of about 10% to 30% of the chip surface with a suitable chip arrangement (for example flip-chip arrangement) or correspondingly. If the phosphor flake is installed over a finished LED, all of the exiting light cone passes through the flake.

The side surfaces of the ceramic phosphor body can be coated with a light metal or noble metal, preferably aluminium or silver. The metal coating has the effect that light does not exit laterally from the phosphor body. Light exiting laterally can reduce the luminous flux to be coupled out of the LED. The metal coating of the ceramic phosphor body is carried out in a process step after the isostatic pressing to give rods or flakes, where the rods or flakes can optionally be cut to the requisite size before the metal coating. To this end, the side surfaces are wetted, for example, with a solution comprising silver nitrate and glucose and subsequently exposed to an ammonia atmosphere at elevated temperature. A silver coating, for example, forms on the side surfaces in the process.

Alternatively, currentless metallisation processes are also suitable, see, for example, Hollemann-Wiberg, Lehrbuch der Anorganischen Chemie [Textbook of Inorganic Chemistry], Walter de Gruyter Verlag or Ullmanns Enzyklopädie der chemischen Technologie [Ullmann's Encyclopedia of Chemical Technology].

The ceramic phosphor body can, if necessary, be fixed to an LED chip serving as baseboard using a water-glass solution.

In a preferred embodiment, the ceramic phosphor body has a structured (for example pyramidal) surface on the side opposite an LED chip. This enables as much light as possible to be coupled out of the phosphor body. The structured surface on the phosphor body is produced by carrying out the isostatic pressing using a compression mould having a structured pressure plate and thus embossing a structure into the surface. Structured surfaces are desired if the aim is to produce the thinnest possible phosphor bodies or flakes. The pressing conditions are known to the person skilled in the art (see J. Kriegsmann, Technische keramische Werkstoffe [Industrial Ceramic Materials], Chapter 4, Deutscher Wirtschaftsdienst, 1998). It is important that the pressing temperatures used are 2/3 to 5/6 of the melting point of the substance to be pressed.

However, embodiments for the application of the silicate phosphors according to the invention to a light-emitting diode are also possible (see Example 4, GaN chip as LED chip), in which a phosphor layer to be applied, which is intended to comprise the silicate phosphors according to the invention, is applied by bulk casting, preferably by bulk casting from a mixture of silicone and homogeneous silicate phosphor particles.

The present invention furthermore relates to a light source which comprises a semiconductor and at least one compound of the formula I.

Particular preference is given here to a light source which comprises a semiconductor and at least one compound of the formula I and at least one other, red-emitting phosphor. This light source is preferably white-emitting or emits light having a certain colour point (colour-on-demand principle).

The red-emitting phosphors employed here are preferably the red-emitting phosphors already described in greater detail above.

The colour-on-demand concept is taken to mean the production of light having a certain colour point using a pc-LED (=phosphor-converted LED) using one or more phosphors.

In a preferred embodiment of the light source according to the invention, the semiconductor is a luminescent indium aluminium gallium nitride, in particular of the formula $In_iGa_jAl_kN$, where $0 \leq i$, $0 \leq j$, $0 \leq k$, and $i+j+k=1$.

In a further preferred embodiment of the light source according to the invention, the light source is a luminescent arrangement based on ZnO, TCO (transparent conducting oxide), ZnSe or SiC or an arrangement based on an organic light-emitting layer (OLED).

In a further preferred embodiment of the light source according to the invention, the light source is a source which exhibits electroluminescence and/or photoluminescence. The light source may furthermore also be a plasma or discharge source.

Possible forms of light sources of this type are known to the person skilled in the art. These can be light-emitting LED chips of various structure.

The silicate phosphors according to the invention can either be dispersed in a resin (for example epoxy or silicone resin) or, in the case of suitable size ratios, arranged directly on the light source or alternatively arranged remote therefrom, depending on the application (the latter arrangement also includes "remote phosphor technology"). The advantages of remote phosphor technology are known to the person skilled in the art and are revealed, for example, by the following publication: Japanese Journ. of Appl. Phys. Vol. 44, No. 21 (2005), L649-L651.

The invention furthermore relates to a lighting unit, in particular for the backlighting of display devices, which comprises at least one light source described above and thus at least one silicate phosphor of the formula I. Lighting units of this type are employed principally in display devices, in particular liquid-crystal display devices (LC displays), having backlighting. The present invention therefore also relates to a display device of this type.

The optical coupling of the lighting unit described above between the silicate phosphor or the phosphor mixture comprising the silicate phosphor according to the invention and the semiconductor can also be achieved by a light-conducting arrangement. This makes it possible for the semiconductor to be installed at a central location and to be optically coupled to the phosphor by means of light-conducting devices, such as, for example, optical fibres. In this way, it is possible to achieve lamps adapted to the lighting wishes which merely consist of one or various phosphors, which can be arranged to form a light screen, and an optical waveguide, which is coupled to the light source. In this way, it is possible to place a strong light source at a location which is favourable for electrical installation and to install lamps comprising phosphors which are coupled to the optical waveguides at any desired locations without further electrical cabling, but instead only by laying optical waveguides.

The present invention furthermore relates to the use of the phosphors according to the invention as conversion phosphor, preferably for the partial or complete conversion of the blue or near-UV emission from a luminescent diode.

Preference is furthermore given to the use of the phosphors according to the invention for the conversion of blue or near-UV emission into visible white radiation.

The use of the silicate phosphors according to the invention in electroluminescent materials, such as, for example, electroluminescent films (also known as lighting films or light films), in which, for example, zinc sulfide or zinc sulfide doped with $Mn^{2+}$, $Cu^+$ or $Ag^+$ is employed as emitter, which emit in the yellow-green region is also advantageous in accordance with the invention. The areas of application of the electroluminescent film are, for example, advertising, display backlighting in liquid-crystal display screens (LC displays) and thin-film transistor (TFT) displays, self-illuminating vehicle licence plates, floor graphics (in combination with a crushresistant and slip-proof laminate), in display and/or control elements, for example in automobiles, trains, ships and aircraft, or also domestic appliances, garden equipment, measuring instruments or sport and leisure equipment.

Even when employed in small amounts in LEDs, the silicate phosphors according to the invention give rise to good LED qualities.

Compared with commercially available silicate phosphors of the formula $EA_{2-x}Eu_xSiO_4$, where EA stands for two or more elements selected from Ca, Sr, Zn and Ba, and x stands for a value from the range $0.01 \leq x \leq 0.25$, the silicate phosphors of the formula I according to the invention have excellent resistance to moisture, which permanently reduces the drop in the intensity of the phosphor over an extended period in contact with atmospheric moisture. This applies, in particular, if the barium content in the phosphors according to the invention is comparatively high, which would result in particular susceptibility to moisture in the application without the addition according to the invention of alkali metal borates. In addition, the silicate phosphors according to the invention have emission spectra whose maximum is neither shifted nor reduced compared with the emission maximum of commercially available silicate phosphors which have not been treated with alkali metal borates. They can therefore be employed successfully in all conventional application media in which conventional silicate phosphors are employed.

The following examples are intended to illustrate the present invention. However, they should in no way be regarded as limiting. All compounds or components which can be used in the compositions are either known and commercially available or can be synthesised by known methods. The temperatures indicated in the examples are always in ° C. It furthermore goes without saying that, both in the description and also in the examples, the added amounts of the components in the compositions always add up to a total of 100%. Percentage data given should always be regarded in the given context. However, they usually always relate to the weight of the part-amount or total amount indicated.

Even without further comments, it is assumed that a person skilled in the art will be able to utilise the above description in its broadest scope. The preferred embodiments should therefore merely be regarded as descriptive disclosure which is absolutely not limiting in any way. The complete disclosure content of all applications and publications mentioned above and below is incorporated into this application by way of reference.

EXAMPLE 1

Preparation of $Sr_{0.9}Ba_{1.02}Eu_{0.08}SiO_4 \cdot 0.02Na_2B_4O_7$

The phosphor according to the invention having the composition $(Sr_{0.9}Ba_{1.02}Eu_{0.08}SiO_4 \cdot 0.02\ Na_2B_4O_7)$ is prepared in two synthesis steps.

Step 1: Preparation of the Orthosilicate Phosphor Having the Composition $Sr_{0.9}Ba_{1.02}Eu_{0.08}SiO_4$ The starting materials $BaCO_3$, $SrCO_3$, $Eu_2O_3$ and $SiO_2$ are mixed vigorously in the stated stoichiometric ratio together with small amounts of the fluxing agent $NH_4Cl$ (about 5% w/w). The starting mixture is subsequently introduced into corundum crucibles and calcined in a high-temperature oven at 1350 C in under reducing atmosphere for 6 hours. The calcined material is cooled, comminuted, washed with water, dried and sieved.

Step 2: Preparation of the Orthosilicate Phosphor According to the Invention having the composition $Sr_{0.9}Ba_{1.02}Eu_{0.08}SiO_4 \cdot 0.02Na_2B_4O_7$ Firstly, 50 g of $Na_2B_4O_7$ (anhydrous, for analysis, Merck, Art. No. 1.06306.0250) are dissolved in 2 l of deionised water (solution A).

For the preparation of the phosphor, 500 g of the untreated phosphor $Sr_{0.9}Ba_{1.02}Eu_{0.08}SiO_4$ are introduced into solution A and stirred for 60 min. The phosphor suspension is subsequently filtered through a suction filter, washed with ethanol and dried in a drying cabinet at about 100° C.

A green silicate phosphor having an emission maximum of about 530 nm as shown in FIG. 1 (spectrum 2) is obtained.

Preparation of Nitridic Phosphors for Mixtures

EXAMPLE 2A

Preparation of a Red-Emitting Phosphor $Sr_2Si_5N_8$:Eu 1.84 g of $Sr_3N_2$, 0.166 g of EuN and 2.33 g of silicon nitride are weighed out and mixed in a nitrogen-filled glove box. The resultant mixture is introduced into a molybdenum crucible and transferred into a tubular furnace. The mixture is subsequently calcined for 8 hours at 1600° C. under a nitrogen/hydrogen atmosphere. After cooling, the crude phosphor is removed, briefly mortared and again introduced into a molybdenum crucible, which is then transferred into a high-pressure furnace. The phosphor is again calcined in this for 8 hours at 1600° C. under a nitrogen pressure of 65 bar. After cooling, the phosphor is removed and suspended in 100 ml of deionised water. The resultant suspension is stirred for 30 minutes, and the stirrer is subsequently switched off. After a few minutes, the supernatant is poured off, and the residue which remains is taken up again in deionised water, filtered off with suction, washed with deionised water until neutral and dried.

EXAMPLE 2B

Preparation of a Red-Emitting Phosphor (Sr, Ca)$AlSiN_3$:Eu 2.22 g of $Sr_3N_2$, 0.33 g of $Ca_3N_2$, 0.05 g of EuN, 1.23 g of AlN and 1.4 g of silicon nitride are weighed out and mixed in a nitrogen-filled glove box. The resultant mixture is introduced into a boron nitride crucible and transferred into a hot isostatic press (HIP). A nitrogen pressure of 500 bar is established, and the material is subsequently heated to 1700° C. and heattreated at this temperature for 4 hours, during which the pressure rises to 1740 bar. After cooling and ventilation, the material is removed and suspended in 100 ml of deionised water. The resultant suspension is stirred for 30 minutes, and the stirrer is subsequenty switched off. After a few minutes, the supernatant is poured off, and the residue which remains is taken up again in deionised water, filtered off with suction, washed with deionised water until neutral and dried.

3. Preparation of Phosphor Mixtures

EXAMPLE 3

$Sr_{0.9}Ba_{1.02}Eu_{0.08}SiO_4 \cdot 0.02\ Na_2B_4O_7$ and Nitride-Based Phosphor

EXAMPLE 3A 10 g of the phosphor according to the invention from step 2 of Example 1 are mixed intimately with 1 g of the phosphor from Example 2A.

EXAMPLE 3B

Analogously to Example 3 A, a mixture comprising the phosphors from step 2 of Example 1 and from Example 2B is prepared.

EXAMPLE 4

Production of a Light-Emitting Diode

The phosphor mixture from Example 3A is mixed with a 2-component silicone (OE 6550 from Dow Corning) in a tumble mixer in such a way that equal amounts of the phosphor mixture are dispersed in the two components of the silicone; the total concentration of the phosphor mixture in the silicone is 8% by weight.

5 ml of each of the two phosphor-containing silicone components are mixed homogeneously with one another and transferred into a dispenser. With the aid of the dispenser, empty LED packages from OSA optoelectronics, Berlin, which contain a 100 μm² GaN chip are filled. The LEDs are then placed in a heating chamber in order to solidify the silicone over 1 h at 150° C.

| Composition | Emission max. [nm] | CIE 1931 x, y | Quantum yield at 435 nm* | Lumen equivalent [lm/W] |
|---|---|---|---|---|
| $Sr_{0.9}Ba_{1.02}Eu_{0.08}SiO_4 \cdot 0.02Na_2B_4O_7$ | 527.3 | 0.299 0.629 | 96% | 496.7 |
| $Sr_{0.9}Ba_{1.02}Eu_{0.08}SiO_4$ | 527.1 | 0.299 0.629 | 97% | 496.9 |

*Quantum yield was determined from the emission spectra and the degrees of reflection at 435 nm Table 1 shows the optical properties of the silicate phosphor according to the invention from step 2 of Example 1 compared with a known silicate phosphor in accordance with step 1 from Example 1.

CIE x and CIE y stand for the coordinates in the CIE standard colour diagram (here 1931 standard observer), which is familiar to the person skilled in the art, by means of which the colour of a light source is described. All the quantities indicated above are calculated from emission spectra of the light source by methods familiar to the person skilled in the art.

The lumen equivalent (lm/W) arises from the product of the standardised emission spectrum I (lambda) with the eye sensitivity curve V (lambda).

EXAMPLE 5

Climate Tests for Checking the Stability of the Phosphors to Moisture

The climate tests with the o-silicate phosphors from steps 1 and 2 of Example 1 are carried out in a Thermotec LHL 113 climate testing cabinet. To this end, 10 LEDs of the PLCC2 package type are in each case filled with the phosphors to be compared. The filling is carried out using a suspension of commercially available LED silicone resin and 15% w/w of the respective phosphor. The LEDs supplied with a constant current of 20 mA are tested in the climate testing cabinet over a period of 1000 h at a relative atmospheric humidity of 85±3% and a temperature of 80±1° C. The results are reproduced in the following spectra (see FIGS. 2 and 3). It can be seen that the phosphors according to the invention comprising $Na_2B_4O_7$ (curve 2 in FIG. 3) are more stable to moisture than the phosphors without $Na_2B_4O_7$.

Figure 1:
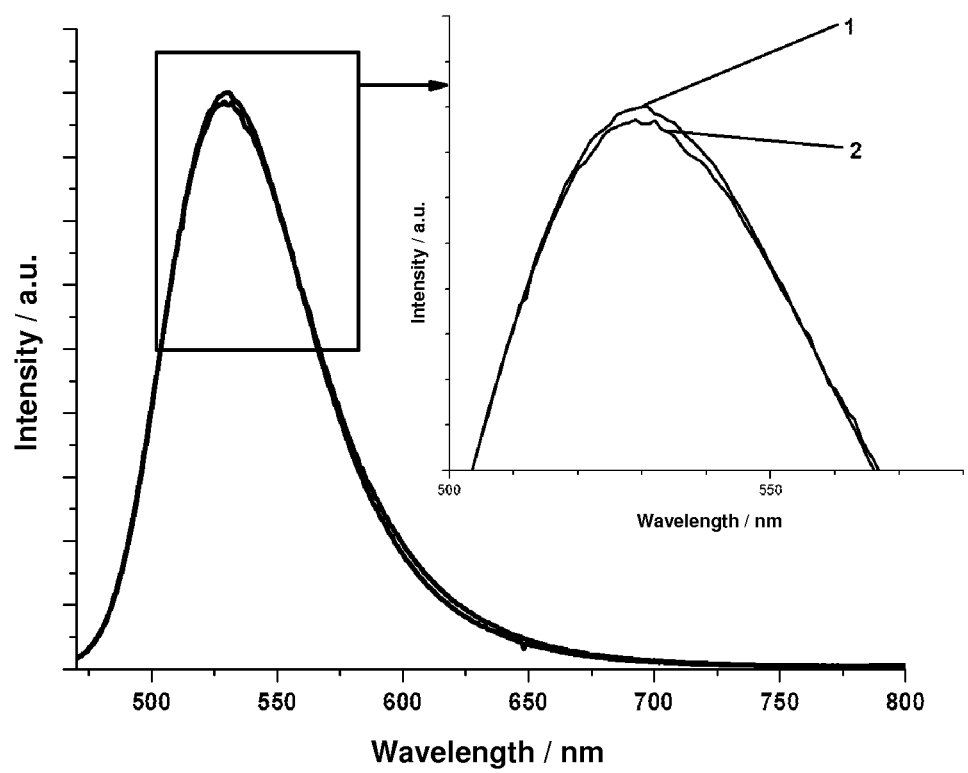
FIG. 1: shows a comparison of the emission spectra of phosphors of the composition $Sr_{0.9}Ba_{1.02}Eu_{0.08}SiO_4$ (spectrum 1) and $Sr_{0.9}Ba_{1.02}Eu_{0.08}SiO_4 \cdot 0.02\ Na_2B_4O_7$ (spectrum 2). The two spectra are recorded at room temperature on a powder layer of semi-infinite thickness using an Edinburgh Instruments FL900 spectrometer and an Xe high-pressure lamp and a Hamamatsu photomultiplier.
Figure 2:
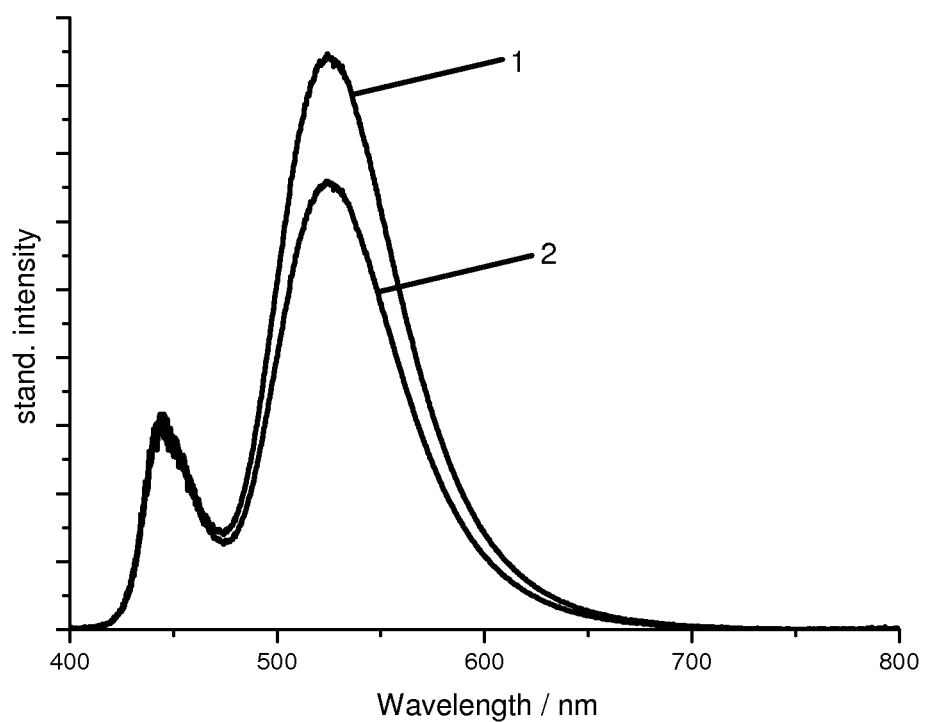
FIG. 2: shows various spectra of an LED in which the orthosilicate phosphor from step 1 of Example 1 (without sodium tetraborate) is employed and is subjected to the climate test described above. Spectrum 1 shows the emission spectrum at time t=0, spectrum 2 shows the emission spectrum of the same LED after an operating duration of 1000 hours at an ambient temperature of 80° C. and an atmospheric humidity of 85%. At this time, the luminance of the LED has dropped by about 18%.
Figure 3:
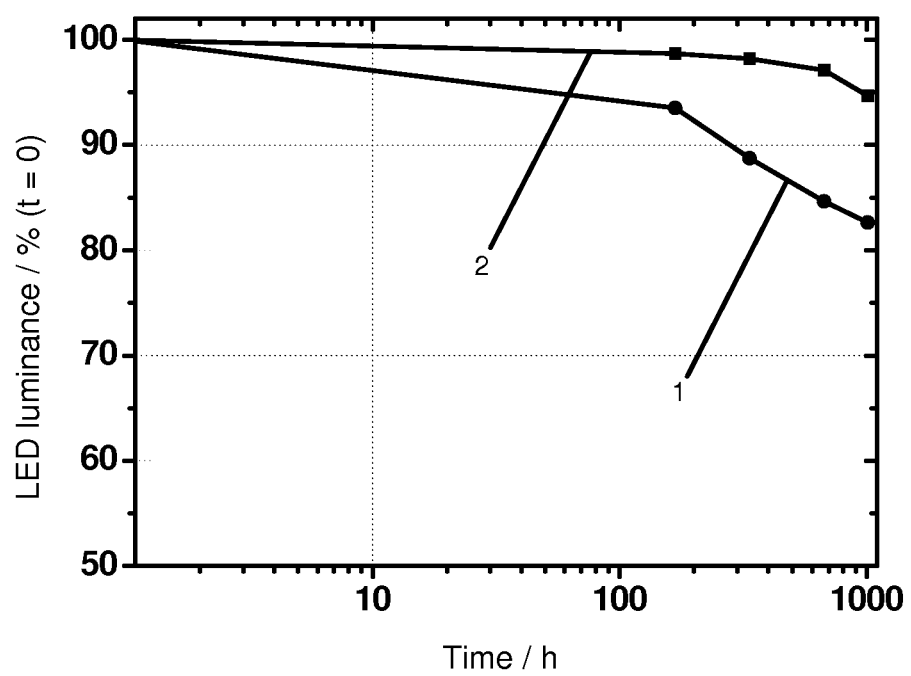
FIG. 3: shows a plot of the luminance of two test LEDs against time. The LEDs are supplied with a constant current of 20 mA over the entire period, the temperature throughout the experiment is 80±1° C., and the relative atmospheric humidity is 85±3%. Curve 1 shows the change in luminance of the orthosilicate phosphor from step 1 of Example 1, while curve 2 shows the change in luminance of the orthosilicate phosphor according to the invention from step 2 of Example 1. The significantly increased stability of the silicate phosphor according to the invention from step 2 of Example 1 is clearly evident; the drop in luminance is only 5%, compared with the 18% already mentioned for the conventional orthosilicate phosphor from step 1 of Example 1.

The invention claimed is:

1. A compound of formula I $$EA_{2-x}Eu_xSiO_4 \cdot a\ M_2B_4O_7 \quad (I)$$

where
EA stands for two or more elements selected from the group consisting of Ca, Sr, Zn and Ba,
M stands for Li, Na or K, and
a stands for a value from the range $0.01 \leq a \leq 0.08$, and
x stands for a value from the range $0.01 \leq x \leq 0.25$.

2. A compound according to claim 1, wherein x stands for a value from the range $0.03 \leq x \leq 0.20$.

3. A compound according to claim 1, wherein a stands for a value from the range $0.01 \leq a \leq 0.05$.

4. A compound according to claim 1, wherein x stands for a value from the range $0.04 \leq x \leq 0.13$.

5. A process for preparing a compound according to claim 1, comprising
a) providing an $M_2B_4O_7$-containing solution, which is solution A, where M=Li, Na or K,
b) providing a phosphor of the composition $EA_{2-x}Eu_xSiO_4$, which is phosphor B, where EA stands for two or more elements selected from the group consisting of Ca, Sr, Zn and Ba, and x stands for a value from the range $0.01 \leq x \leq 0.25$,
c) adding and intimately mixing phosphor B with solution A,
d) washing, and
e) subsequent drying.

6. A mixture comprising at least one compound according to claim 1 and at least one further phosphor.

7. A mixture according to claim 6, wherein the at least one further phosphor is at least one red-emitting phosphor which is an Eu-doped sulfoselenide, Eu- and/or Ce-doped nitride, oxynitride, alumosiliconitride and/or Mn(IV)-doped oxide and/or fluoride.

8. A light source, comprising a semiconductor and at least one compound according to claim 1.

9. A light source according to claim 8, wherein the semiconductor is a luminescent indium aluminium gallium nitride.

10. A light source according to claim 8, wherein the semiconductor is a luminescent indium aluminium gallium nitride of formula $In_iGa_jAl_kN$, where $0 \leq i$, $0 \leq j$, $0k$, and $I+j+k=1$.

11. A lighting unit, comprising at least one light source according to claim 8.

12. A lighting unit according to claim 11, which is suitable for the backlighting of a display device.

13. A display device, containing at least one lighting unit according to claim 11.

14. A liquid-crystal display device, comprising at least one lighting unit according to claim 11.

15. A method for partial or complete conversion of the blue or near-UV emission from a luminescent diode, or in an electroluminescent material, or in an electroluminescent film comprising achieving said conversion by a compound of claim 1 as a conversion phosphor.

16. A method for the backlighting of a display device, comprising backlighting said device by a lighting unit according to claim 11.

* * * * *

UNITED STATES PATENT AND TRADEMARK OFFICE
CERTIFICATE OF CORRECTION

| | | |
|---|---|---|
| PATENT NO. | : 8,906,264 B2 | Page 1 of 1 |
| APPLICATION NO. | : 13/988040 | |
| DATED | : December 9, 2014 | |
| INVENTOR(S) | : Tim Vosgroene et al. | |

It is certified that error appears in the above-identified patent and that said Letters Patent is hereby corrected as shown below:

IN THE CLAIMS:

Column 12, line 42 (Claim 10), reads: -- of formula $In_iGa_jAl_kN$, where $0 \leq i$, $0 \leq j$, $0k$, and $I+j+k=1$. --

Should read as: -- of formula $In_iGa_jAl_kN$, where $0 \leq i$, $0 \leq j$, $0 \leq k$, and $i+j+k=1$. --

Signed and Sealed this
Seventh Day of July, 2015

Michelle K. Lee
*Director of the United States Patent and Trademark Office*